United States Patent [19]

Kao

[11] Patent Number: 6,011,502
[45] Date of Patent: Jan. 4, 2000

[54] PSEUDO TWO-STEP CURRENT-MODE ANALOG-TO-DIGITAL CONVERTER

[75] Inventor: Hsueh-Wu Kao, Hsinchu Hsien, Taiwan

[73] Assignee: Industrial Technology Research Institute, Hsinchu, Taiwan

[21] Appl. No.: 09/041,908

[22] Filed: Mar. 13, 1998

[30] Foreign Application Priority Data

Dec. 31, 1997 [TW] Taiwan ................................ 86120105

[51] Int. Cl.$^7$ ............................. H03M 1/12; H03M 1/78
[52] U.S. Cl. ........................................... 341/156; 341/154
[58] Field of Search .............................. 360/48; 341/155, 341/156, 158, 127, 135; 327/77

[56] References Cited

U.S. PATENT DOCUMENTS

| | | | |
|---|---|---|---|
| 3,597,761 | 8/1971 | Fraschilla et al. ....................... | 341/156 |
| 5,289,191 | 2/1994 | Elms ........................................ | 341/127 |
| 5,689,260 | 11/1997 | Vallancourt ............................... | 341/156 |
| 5,889,487 | 3/1999 | Burns et al. ............................... | 341/159 |

*Primary Examiner*—Michael Tokar
*Assistant Examiner*—Patrick Wamsley
*Attorney, Agent, or Firm*—Harness, Dickey & Pierce, P.L.C.

[57] ABSTRACT

A pseudo two-step current-mode analog-to-digital converter is disclosed, which carries out fine comparison in current mode such that the analog-to-digital conversion can be executed correctly even when the input signal is very small, and thus conserves chip area for implementing the series-connecting resistors. The analog-to-digital converter according to the present invention comprises: a reference voltage generator disposed between a first voltage (V1) and a second voltage (V2) to provide a plurality of reference voltage nodes; a first comparing device for comparing the analog input voltage with the reference voltages to output a set of rough codes; a first logic device selectively outputting corresponding bit codes as the output of the significant (higher) bits in accordance with the rough codes; a current conversion device for converting the analog input voltage and the voltage level corresponding to the significant bit codes to an analog input current and a significant-bit reference current respectively, and generating a plurality of fine reference currents; a second comparing device for comparing a differential current with the fine reference currents to output a set of fine codes, wherein the differential current is the difference between the analog input current and significant-bit reference current; a second logic device selectively outputting corresponding bit codes as the output of the least (lower) bits in accordance with the rough codes; and a output encoder receiving the significant bit codes and the least bit codes and outputting a set of digital codes after error correcting the significant bit codes.

5 Claims, 6 Drawing Sheets

PSEUDO TWO-STEP CURRENT-MODE ANALOG-TO-DIGITAL CONVERTER

BACKGROUND OF THE INVENTION

1. Field of the Invention

The present invention relates in general to an analog-to-digital converter, more specifically, to a pseudo two-step current-mode analog-to-digital converter.

2. Description of the Related Art

As electronic and digital technology advances, the electronic data in electronic systems are all digitized and processed by means of a strong CPU, thereby enhancing the power and versatility of electronic systems. The analog-to-digital converter (hereinafter referred to as an ADC converter) is an indispensable element for converting analog signals to digital data for further processing, because it is the transforming medium between the analog and digital worlds.

In general, either parallel-connected converters or flash converters are utilized to implement ADC converters, both of which output binary codes from an encoder after an analog signal is sampled and its voltage level is compared with several reference voltage levels. Therefore, the binary codes correspond to one of those reference voltage levels closest to the voltage level of the analog signal.

FIG. 1 schematically depicts the blocking circuit diagram of a conventional flash ADC converter. In the Fig., Vin designates an analog input signal, and binary codes $D_1$–$D_N$ constitute digital output codes sent out from an encoder 10. Thus, when composed of N-bits, the digital output codes can provide a resolution of N-bits for the analog input signal Vin. Accordingly, the ADC converter should comprise $2^N$ reference voltage sources, Vref_1, Vref_2, . . . , and Vref_$2^N$, as shown in the block 12, and $2^N$ comparators, CP1, CP2, . . . , and CP2$^N$, as shown in the block 14. Apparently, in accordance with such a structure, the numbers of the reference voltage sources as well as the comparators are in proportion to the required resolution. In other words, the higher the resolution that is required, the greater the number of reference voltage sources and comparators increase by an exponent of 2. Therefore, the number of electronic devices, and the power consumption as well as the complexity for circuit design thereof will be increased greatly, in exchange for fulfilling the high-resolution purpose.

Referring to FIG. 2, the blocking circuit diagram of a conventional two-step analog-to-digital converter is schematically shown. The reference voltage source 20 includes a plurality of voltage sources to provide a set of rough reference voltages and a set of fine reference voltages. A rough comparing means 21 receives a set of rough reference voltages and an analog input signal Vin and, after comparing the input signal Vin with the set of rough reference voltages, the rough comparing means outputs the upper byte signal 22 as the input of the switch-control logic means 23 and the encoder 26. According to the output signal 22, the fine comparing means 24 are connected to an appropriate set of fine reference voltages by the control of the switch-control logic means. (The fine comparing means 27 is the same under the control of the switch-control logic means.) After comparing the input signal Vin with fine reference voltages, the fine comparing means outputs a lower byte signal 25. The upper byte signal 22 and the lower byte signal 25 are received by the encoder 26 and are transformed into digital output codes {$D_1$,$D_2$,$D_3$, . . . ,$D_N$}. When the fine comparing means 24 is being compared, the analog-to-digital converter keeps taking the next sample of the analog input signal Vin and holds the sample in the rough comparing means 21 and in the other fine comparing means 27. When the fine comparing means 24 finishes its comparison, then the rough comparing means 22 and the fine comparing means 27 will undergo the analog-to-digital transformation as described above. By such an iterative way of operation, the analog signals can be transformed into digital signals.

It is quite obvious from the above description, the conventional two-step ADC converter carries out its comparison in voltage mode, and therefore cannot obtain a fast processing speed. As the comparator in the conventional ADC converter operates in voltage mode, therefore the voltage ranges of the input signals must be considerable, otherwise the ADC converter cannot convert the data accurately.

SUMMARY OF THE INVENTION

In view of the above problems, an object of the present invention is to provide a pseudo two-step current-mode analog-to-digital converter, which carries out fine comparison in current mode rather than the voltage mode used in conventional converters, thereby preventing the conversion errors due to comparing input signals of low voltage level. In addition, the series-connected resistors used for fine comparison in conventional ADC converter can be eliminated, thereby reducing the chip area for implementing ADC converter. The ADC converter according to the present invention is also appropriate for pipeline design, and provides direct error correction.

The present invention achieves the above-indicated objects by providing a pseudo two-step current-mode analog-to-digital converter for converting an analog input voltage to digital output codes which comprises: a reference voltage generator disposed between a first voltage (V1) and a second voltage (V2) to provide a plurality of reference voltage nodes; a first comparing device for comparing the analog input voltage with the reference voltages to output a set of rough codes; a first logic device selectively outputting corresponding bit codes as the output of the significant (higher) bits in accordance with the rough codes; a current conversion device for converting the analog input voltage and the voltage level corresponding to the significant bit codes to a analog input current and a significant-bit reference current respectively, and generating a plurality of fine reference currents; a second comparing device for comparing a differential current with the fine reference currents to output a set of fine codes, wherein the differential current is the difference between the analog input current and significant-bit reference current; a second logic device selectively outputting corresponding bit codes as the output of the least (lower) bits in accordance with the rough codes; and a output encoder receiving the significant bit codes and the least bit codes and outputting a set of digital codes after error correcting the significant bit codes.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1:
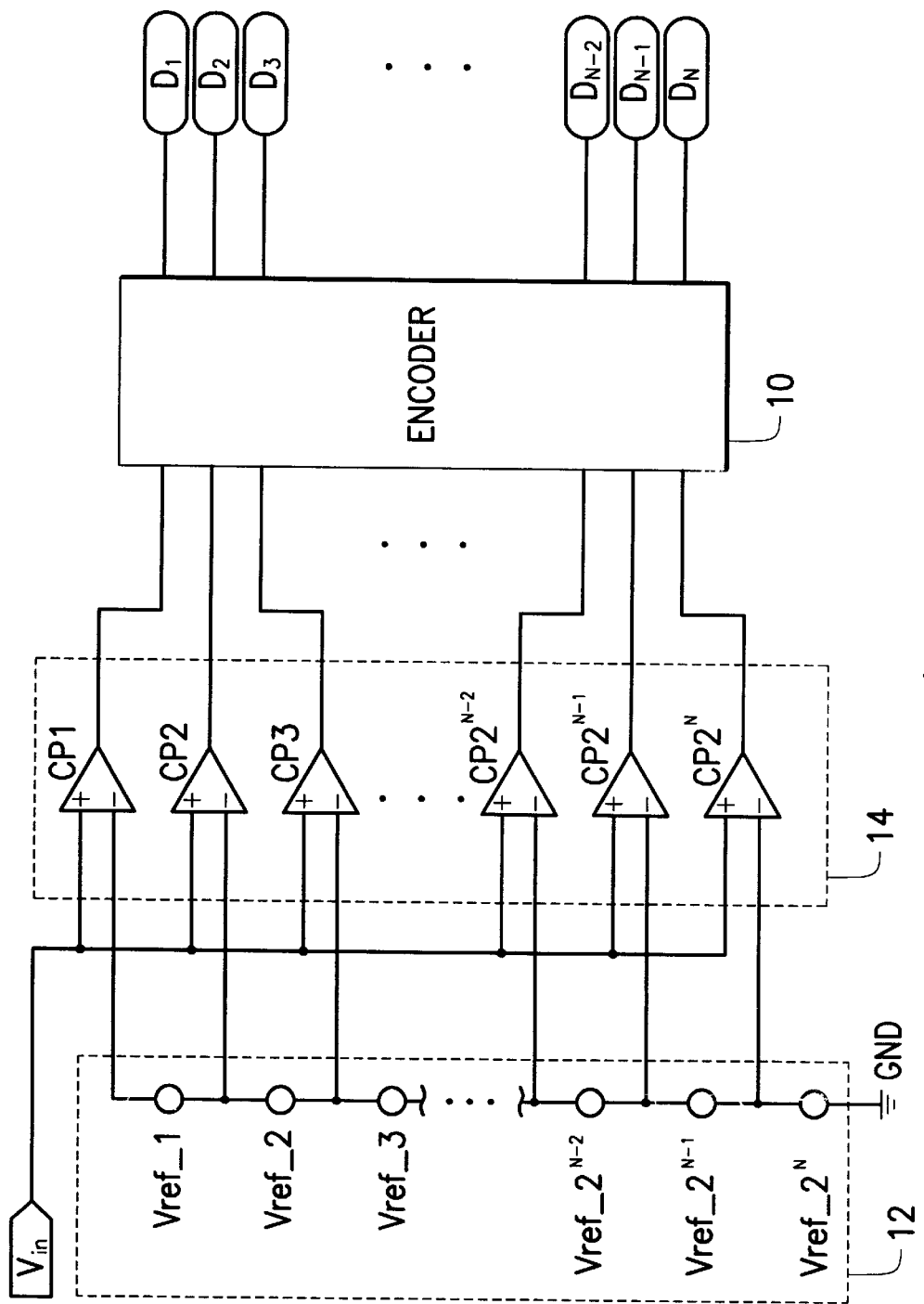
FIG. 1 schematically depicts the blocking circuit diagram of a conventional flash analog-to-digital converter.
Figure 2:
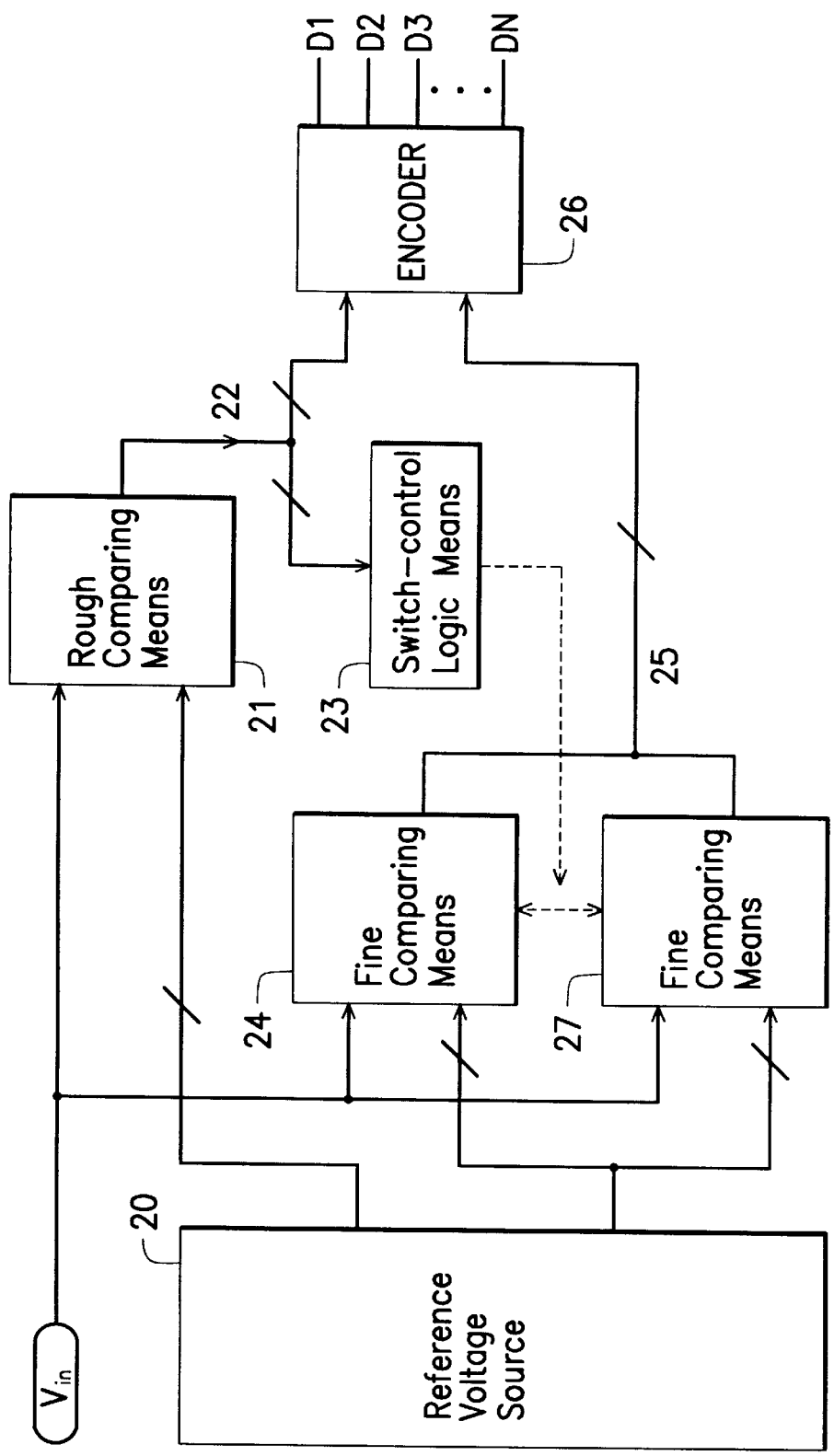
FIG. 2 schematically depicts the blocking circuit diagram of a conventional two-step analog-to-digital converter.
Figure 3:
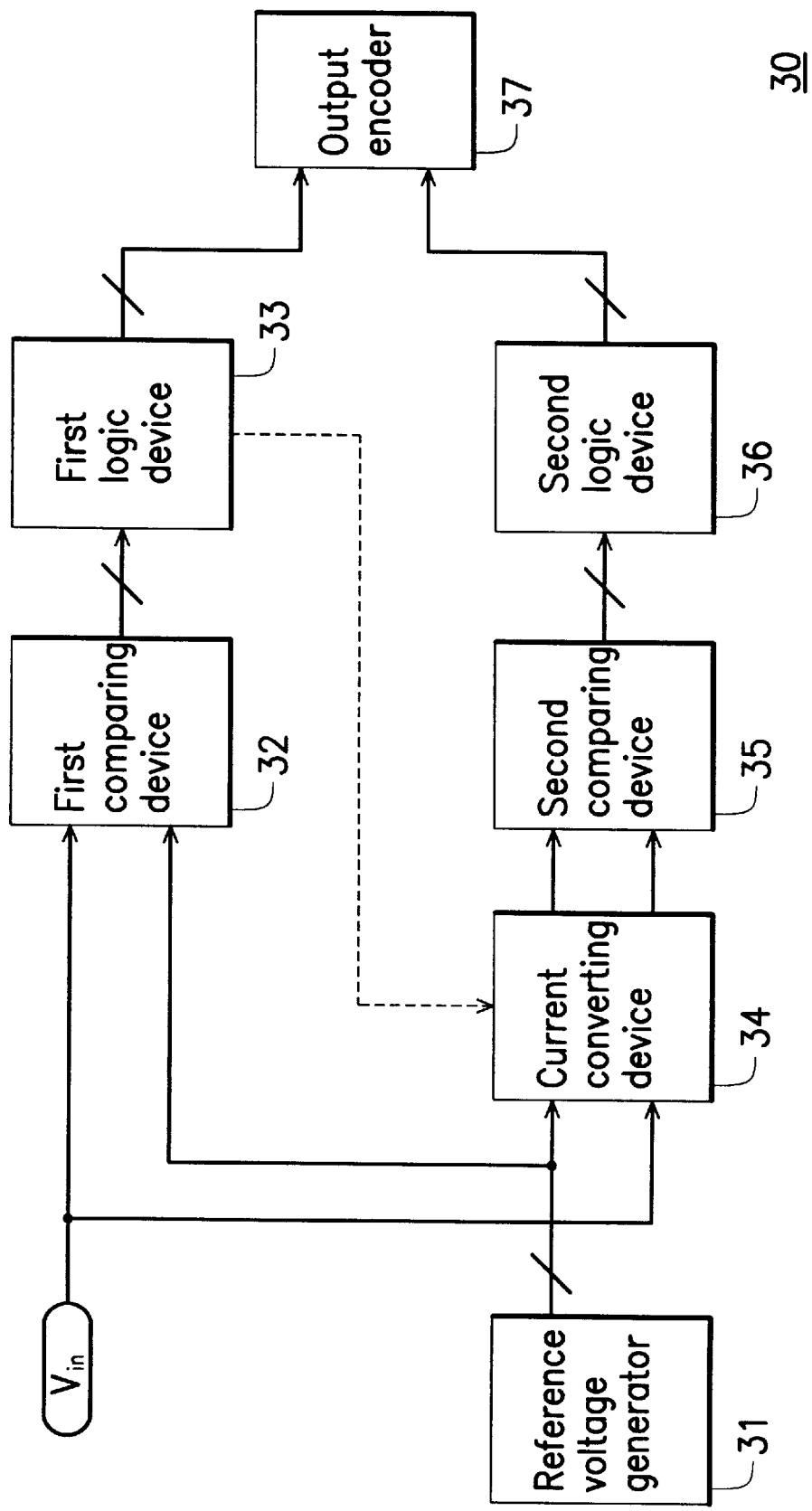
FIG. 3 schematically depicts the blocking diagram of one preferred embodiment of a pseudo two-step analog-to-digital converter in accordance with the present invention.

A 4-bit ADC converter is used as an example for explaining the present invention. Referring to FIG. 3, the pseudo two-step ADC converter 30 in accordance with the present invention comprises: a reference voltage generator 31; a first comparing device 32; a first logic device 33; a current conversion device 34; a second comparing device 35; a second logic comparing device 36; and an output encoder 37.

Figures 4A, 4B:
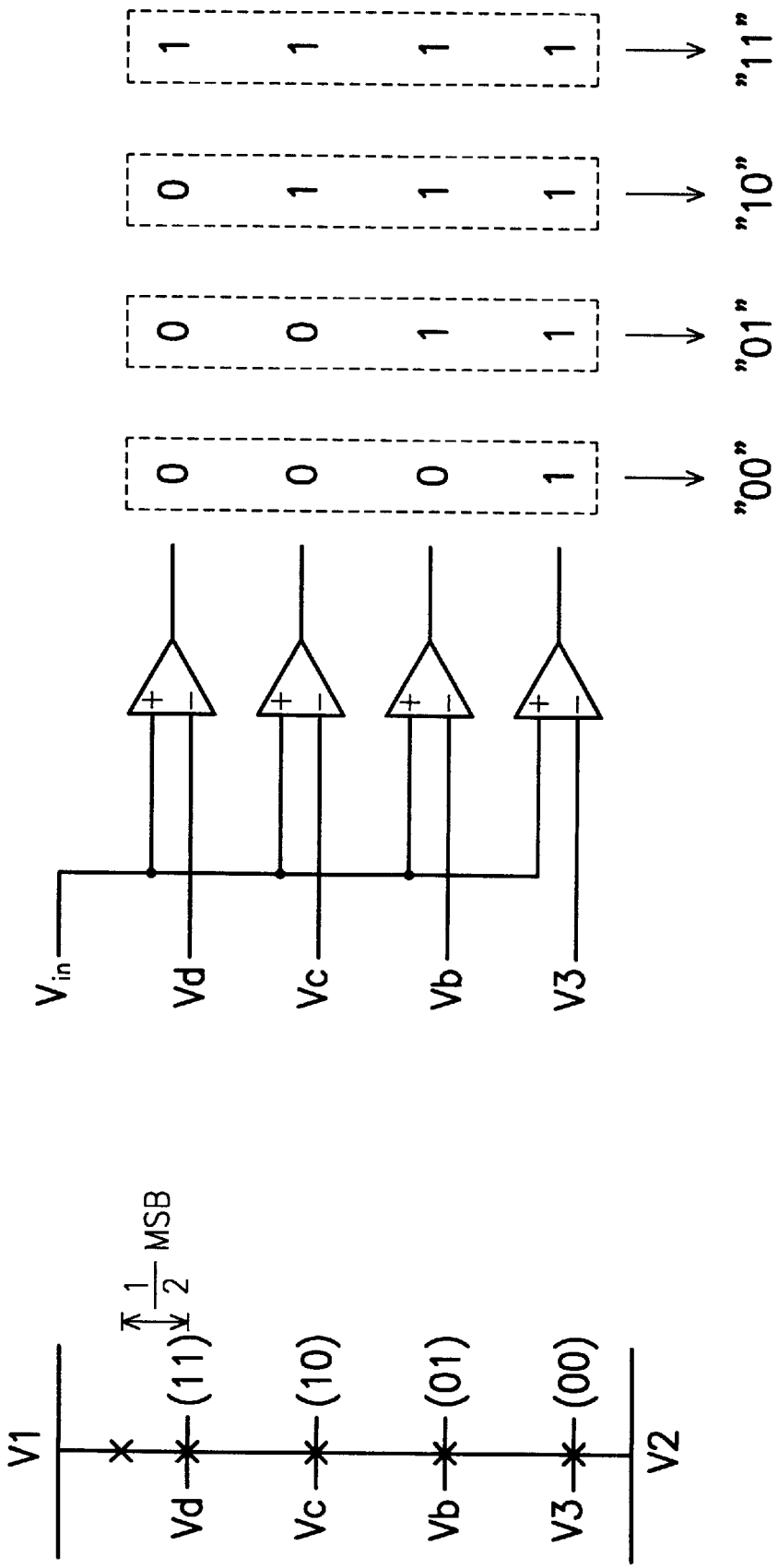
FIG. 4(a) schematically depicts the blocking diagram of a reference voltage generator applied in the analog-to-digital converter in FIG. 3.
FIG. 4(b) and 4(c) schematically depict the blocking diagrams of the first and the second comparing devices, respectively, applied in the analog-to-digital converter in FIG. 3.

The reference voltage generator 31 is disposed between a first voltage V1 and a second voltage V2. A third voltage V3 between voltage V1 and V2 serves as the corresponding analog voltage with respect to the significant-bit (high-bit) output codes "00". The analog input voltages for conversion are within the range of V3 and V2. The voltage segment between first voltage V1 and third voltage V3 is further divided into four equal voltage segments; that is, the voltage differences of V1–Vd, Vd–Vc, Vc–Vb, and Vb–V3 are the same. The voltages Vb, Vc, and Vd serve as the corresponding analog voltages with respect to the significant-bit output codes "01", "10", and "11" respectively, as depicted in FIG. 4(a). The difference between the third voltage V3 and the second voltage V2 is one second of the voltage level of every voltage segment.

When the ADC converter receives an analog input voltage $V_{IN}$, it compares the input voltage $V_{IN}$ with the voltage V3, Vb, Vc, and Vd respectively, and outputs a set of rough codes. Since the significant bit of the output codes includes two bits, thus the first comparing device 32 comprises four comparators. One input of each of the four comparators is coupled to V3, Vb, Vc, and Vd respectively, and the other inputs of the four comparators are coupled to the analog input voltage $V_{IN}$, as depicted in FIG. 4(b). The rough code output form the first comparing device 32 consists of successive digits, wherein the lowest value to highest vale such as 0001, 0011, 0111, and 1111 are in correspondence with the significant bit codes "00", "01", "10", and "11" respectively. Provided that the analog input voltage is located with the range between voltage Vd and Vc, then the first comparing device 32 outputs the rough bit code of "0111".

The rough bit code "0111" is coupled to the first logic device 33 to selectively output the corresponding significant-bit code (MSB), that is "10".

The current converting device 34 transforms the analog input voltage into analog input current $I_{IN}$, wherein $I_{IN} = (V_{IN} - V_2)/R$, and R is a transfer resistor. Also, a significant-bit reference current $I_{REF}$ is obtained that corresponds with the significant-bit code outputted form the first logic device 33, wherein $I_{REF} = I_{MSB} \times f(Di)$. $I_{MSB}$ has the value of (V1–V3)/(4R). The voltage value of (V1–V3)/R means to transfer the input voltage range into corresponding current, and because the significant-bit code has 2 bits, thus (V1–V3)/R is divided by 4 to serve as the basic rough bit current $I_{MSB}$ corresponding to the increment of the significant-bit code. The value of the function f(Di) can be 0, 1, 2, or 3 corresponding to the significant-bit code (MSB), "00", "01", "10", "11" respectively. Meanwhile, the reference significant-bit current $I_{REF}$ is subtracted from the analog input current $I_{IN}$ to obtain a differential current $\Delta I$, which serves as a corresponding least-bit (lower-bit) current. It is quite obvious that the differential current $\Delta I$ is greater than the real least-bit current by $I_{MSB}/2$, for error-correcting the significant bit codes (MSB).

Figure 4C:
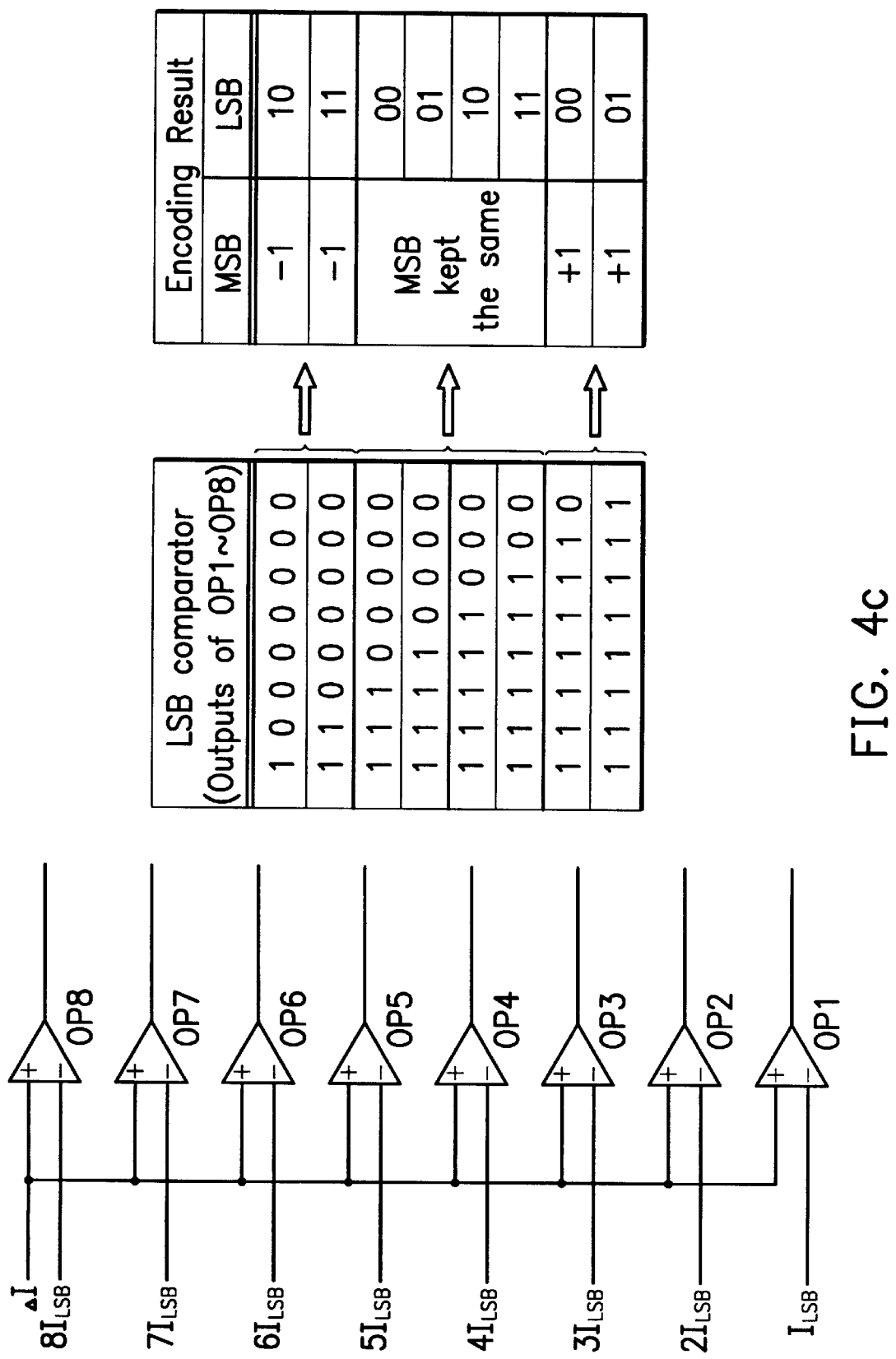

In this embodiment, the least-bit part of the digital output codes also has 2 bits. Therefore, the fine current $I_{LSB}$ corresponding to the increment of a least bit equals $I_{MSB}/4$ (i.e. (V1–V3)/16R). The current converting device generates $2 \times 2^2$ sets of fine reference currents $I_{LSB} \times k$, and is outputted to the second comparing device 35, where k=1~8. The second comparing device 35 compares the fine reference currents with the differential current $\Delta I$, where $\Delta I = I_{IN} - I_{MSB} \times f(Di)$ Referring to FIG. 4(C), the second comparing device 35 comprises 8 comparators OP1~OP8. The eight comparators compare the fine reference currents $I_{LSB}$, $2I_{LSB}$, . . . , $8I_{LSB}$ with the differential current $\Delta I$, and output a set of fine codes to a second logic device 36. Among the above eight comparators, OP3~OP6 are used for fine comparison. The output codes of the comparators OP6~Op3 are "0001", "0011", "0111", "1111" corresponding to the least-bit codes "00", "01", "10", "11" respectively, wherein, if $\Delta I$ is greater than the value of $I_{LSB} \times k$, the output of the corresponding comparator is "1". The comparators OP1~OP2 and OP7~OP8 are used for error correction.

Since $\Delta I$ is greater than the current corresponding to the least (or lower) bit by $I_{MSB}/2$ (in this embodiment is $I_{LSB} \times 2$), therefore the error detection of the MSB can be carried out through the comparison results between $\Delta I$ and $I_{LSB} \times k$ (k=1~8), that is the outputs of the comparators OP1~OP2 and OP7~OP8. If the outputs of OP1 and OP2 are "0", it means $\Delta I (= I_{IN} - I_{REF})$ is less than $I_{LSB} \times 2$, resulting from the error output of the MSB which makes f(Di) and $I_{REF}$ increase. Similarly, if the outputs of OP7 and OP8 are "1", it means the error output of the MSB makes f(Di) decrease.

The second logic device 36 receives the fine codes and decodes the output codes of the comparators OP6~OP3 to generate the least-bit code (LSB). The relations between a part of the fine code outputs and the least-bit code are "0001", "0011", "0111", and "1111" corresponding to "00", "01", "10", and "11" respectively. Furthermore, the outputs of the comparators OP1, OP2, OP7, and OP8 are detected by the second logic device 36 to active the output encoder 37 for error correcting the MSB. As show in FIG. 4c, when the output of the comparators OP1~OP8 is "10000000" or "11000000", the output encoder 37 subtracts 1 from the significant-bit code (MSB), and when the output of the comparators OP1~OP8 is "11111110" or "11111111", the output encoder 37 adds 1 to the significant-bit code, and the output encoder 37 does not change the MSB except for the above conditions. The output encoder 37 outputs the MSB and LSB to generate digit codes, after error-correcting the MSB.

Figure 5:
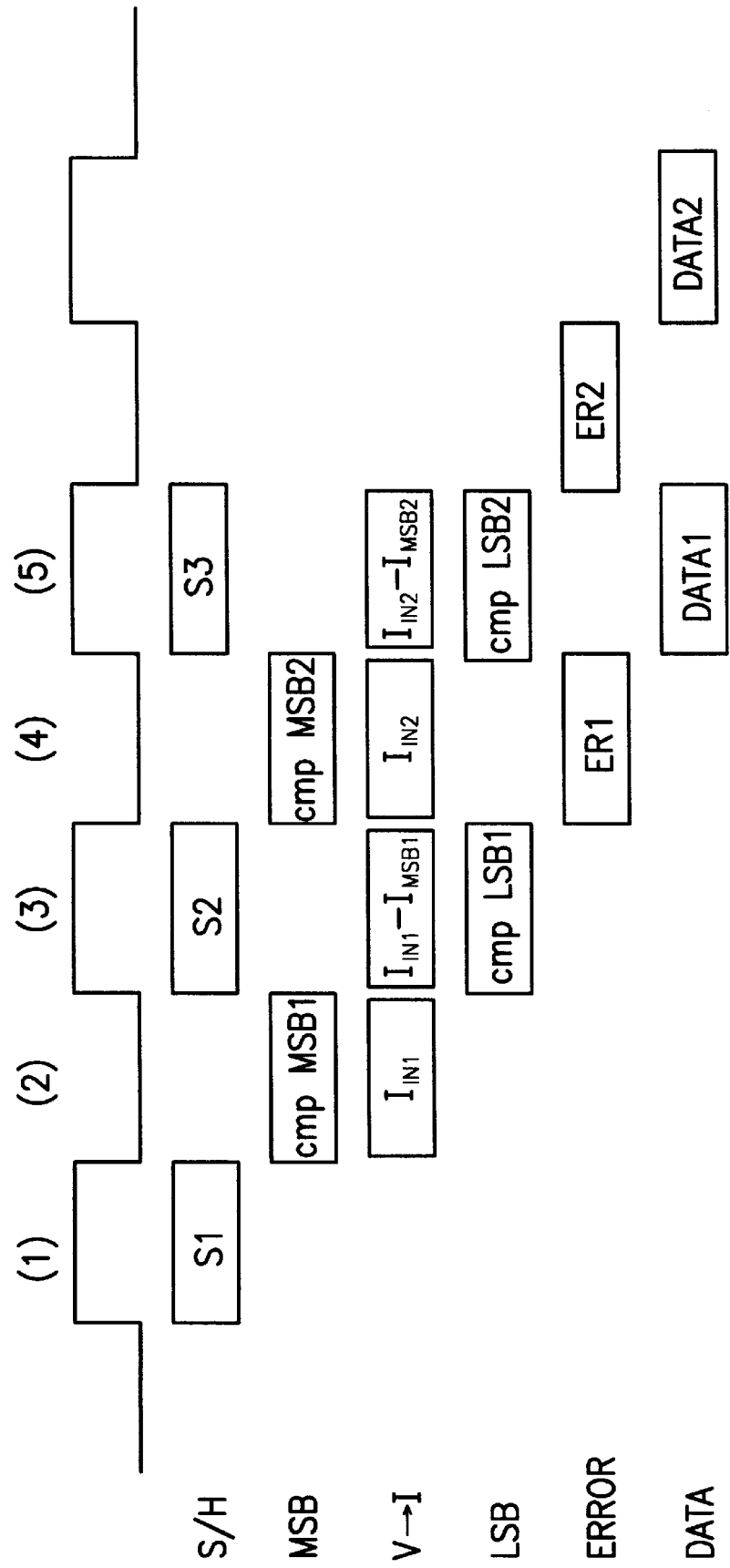
FIG. 5 schematically depicts the timing diagram while the analog-to-digital converter as shown in FIG. 3 is operated.

FIG. 5 schematically depicts the timing diagram while the ADC as shown in FIG. 3 is operated. During time period (1), the ADC takes samples of the input voltage to obtain sample voltage S1. During time period (2), the first comparing device 32 compares the sample voltage S1 with the reference voltage, and then the first logic device 33 decodes the rough code output to obtain a significant-bit code (MSB1) and a corresponding reference current $I_{REF}$. The current conversion device 34 converts the input voltage into input current $I_{IN1}$, and meanwhile the second comparing device 35 generates the differential current $\Delta I(=I_{IN}-I_{MSB1})$. During time period (3), the second comparing device 35 compares $\Delta I$ with the fine reference current to obtain fine codes. Then the second logic device 36 decodes the fine code to obtain least-bit codes (LSB1). In the meantime, the first comparing device 35 continues to sample the analog input voltage to produce sample voltage S2. During time period (4), the output decoder 37 carries out error detection to MSB1 according to the decoding output from the second logic device 36 to carry out error correction (ER1). Simultaneously, the next significant-bit code MSB2 and input current $I_{IN2}$ are generated as described during time period (2). During time period (5), the output encoder 37 outputs the digital code DATA1, completing the data conversion. Simultaneously, $I_{MSB2}$, LSB2, and sample voltage S3 are also generated as described above, such that the analog input voltages are converted into digital codes in iteration.

From the above description, it is obvious that the error conversion due to the lower range limitation of the input voltage in conventional ADC can be overcome by carrying out fine comparison in current mode instead of voltage mode. The series connected resistors used in voltage mode comparison can be eliminated, therefore saving chip area. Furthermore, direct error correction is provided, and the ADC structure can be easily applied to pipeline design.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A pseudo two-step current-mode analog-to-digital converter for converting an analog input voltage to digital output codes comprising:

a reference voltage generator disposed between a first voltage (V1) and a second voltage (V2) to provide a plurality of reference voltages;

a first comparing device for comparing said analog input voltage with said reference voltages to output a set of rough codes;

a first logic device selectively outputting corresponding bit codes as the output of the significant (higher) bits in accordance with said rough codes;

a current conversion device for converting said analog input voltage and the voltage level corresponding to said significant bit codes to an analog input current and a significant-bit reference current respectively, and generating a plurality of fine reference currents;

a second comparing device for comparing a differential current with said fine reference currents to output a set of fine codes, wherein said differential current is the difference between said analog input current and significant-bit reference current;

a second logic device selectively outputting corresponding bit codes as the output of the least (lower) bits in accordance with said rough codes; and an output encoder receiving said significant bit codes and said least bit codes and outputting a set of digital codes after error correcting said significant bit codes.

2. The analog-to-digital converter as claimed in claim 1, wherein the voltage difference between said first voltage (V1) and a third voltage (V3) is divided into a plurality of equal voltage segments, and said third voltage (V3) is higher than said second voltage (V2) by one second of the level of said voltage segment, and the node voltages of said third voltage and all voltage segments serve as said voltage nodes.

3. The analog-to-digital converter as claimed in claim 1, wherein said second voltage (V2) serves as a basic reference voltage such that said analog input voltage and the difference between said first voltage (V1) and second voltage (V2) can be converted to said analog input current and a basic current respectively by said current conversion device, and said basic current is divided by the number of the voltage nodes between said first voltage (V1) and said second voltage (V2) to obtain a rough bit current ($I_{MSB}$), and the significant-bit reference current is obtained by multiplying said rough bit current with the corresponding analog value of said significant bit codes, and said fine reference currents are generated by means of said rough bit current.

4. The analog-to-digital converter as claimed in claim 3, wherein a fine bit current ($I_{LSB}$) is obtained by dividing said rough bit current ($I_{MSB}$) with a number of $2^N$, and the other current, $2I_{LSB}$, $3I_{LSB}$ to $(2^N+x)I_{LSB}$, are generated to serve as said fine reference currents, where N is the bit number of said least bit codes, and x is the bit range for correction.

5. The analog-to-digital converter as claimed in claim 1, wherein said second comparing device further comprises a plurality of fine comparators and every said fine comparator compares said differential current with one of said fine reference currents respectively, and the output bits of all said fine comparators serve as said fine codes, and the number of said fine comparators is $2^N+p$, where N is the bit number of said least bit codes and p indicates how many of the fine comparators are used for error correction.

* * * * *